United States Patent
Sawai et al.

(10) Patent No.: US 6,313,569 B1
(45) Date of Patent: Nov. 6, 2001

(54) PIEZOELECTRIC DEVICE AND METHOD FOR MANUFACTURING THE SAME

(75) Inventors: Kunio Sawai, Ishikawa-ken; Motohide Yonemura; Syuji Fujii, both of Takaoka, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/575,358

(22) Filed: May 19, 2000

(30) Foreign Application Priority Data

May 24, 1999 (JP) .................................................. 11-142893

(51) Int. Cl.$^7$ .................................................. H01L 41/08
(52) U.S. Cl. .......................... 310/366; 310/320; 310/340; 310/348
(58) Field of Search .................................... 310/320, 366, 310/348, 340

(56) References Cited

U.S. PATENT DOCUMENTS 5,844,348 * 12/1998 Gamo .................................... 310/340
5,886,457 * 3/1999 Maesaka et al. ..................... 310/348
6,124,762 * 10/2000 Gamo .................................... 310/320

* cited by examiner

Primary Examiner—Thomas M. Dougherty
(74) Attorney, Agent, or Firm—Keating & Bennett, LLP

(57) ABSTRACT

A piezoelectric device includes a piezoelectric substrate having a piezoelectric driving unit and provided with outer coating substrates laminated on major surfaces thereof via adhesive layers, and external electrodes provided on the outer surfaces of a layered body included in the piezoelectric device. In the piezoelectric device, each of the adhesive layers includes a first layer of an adhesive having a Shore D hardness after curing of not more than approximately 60, and disposed so as not to be exposed in a region of lateral side surfaces of the layered body provided with the external electrodes, a second layer of an adhesive having a Shore D hardness of at least approximately 60, and a third layer of an adhesive having a Shore D hardness of at least approximately 60 and having a viscosity before curing of at least approximately $3.0 \times 10^5$ mPas at a temperature of 25° C. The third layer is disposed between the periphery of the first layer and the region of the lateral side surfaces of the layered body provided with the external electrodes.

19 Claims, 5 Drawing Sheets

PIEZOELECTRIC DEVICE AND METHOD FOR MANUFACTURING THE SAME

BACKGROUND OF THE INVENTION

1. Field of the Invention

The present invention relates to piezoelectric devices used as piezoelectric resonators and piezoelectric filters and to methods for manufacturing the same. In particular, the present invention relates to a piezoelectric device including a piezoelectric substrate having outer coating substrates secured on two surfaces thereof via adhesive layers, the piezoelectric substrate including an energy-trap-type piezoelectric vibration unit. The present invention also relates to a method for manufacturing such a piezoelectric device.

2. Description of the Related Art

In an energy-trap-type piezoelectric device, a piezoelectric vibration unit is provided partially on a piezoelectric substrate. The piezoelectric vibration unit must be sealed in a manner such that the piezoelectric vibration unit is not prevented from vibrating.

A piezoelectric device of the energy-trap-type described above is disclosed in Japanese Unexamined Patent Application Publication No. 8-335844. The piezoelectric device is described below with reference to FIGS. 4 and 5.

A piezoelectric device 51 shown in FIG. 4 includes a piezoelectric substrate 52 laminated with outer coating substrates 53 and 54 on the upper and lower surfaces thereof. A layered body defined by the piezoelectric substrate 52 and the outer coating substrates 53 and 54 is provided with external electrodes 55, 56, and 57.

As shown in FIG. 5, the piezoelectric substrate 52 includes driving electrodes provided partially on the upper and lower surfaces of the piezoelectric substrate 52, which define piezoelectric vibration units 52a and 52b. The outer coating substrates 53 and 54 are bonded to the piezoelectric substrate 52 via adhesive layers which have through-holes to provide spaces for the vibration of the piezoelectric vibration units 52a and 52b.

In the piezoelectric device 51, the adhesive layers include first layers 58 and 59 which are located adjacent to the outer coating substrates 53 and 54, respectively, and second layers 60 and 61 which are disposed adjacent to the piezoelectric substrate 52. The first layers 58 and 59 include a soft adhesive having a Shore D hardness of not more than 60, and the second layers 60 and 61 include a hard adhesive having a Shore D hardness of at least 60. The first layers 58 and 59 are provided with through-holes 58a and 58b and through-holes 59a and 59b, respectively. The second layers 60 and 61 are provided with through-holes 60a and through-holes 61a, respectively.

An excellent damping effect and a space for vibration are provided by the first soft adhesive layers 58 and 59 and the second hard adhesive layers 60 and 61 laminated in the piezoelectric device 51, respectively. However, when the outer coating substrates 53 and 54 expand or contract, for example, by heating when mounting on a printed circuit board, the stress produced by the expansion or contraction is absorbed by the first layers 58 and 59, thereby suppressing variation in the frequency characteristics of the device after soldering and when kept in a humid environment.

The cut-away through-holes 58b and 59b are provided at the periphery of the first layers 58 and 59 for preventing the external electrodes 55, 56, and 57 from breaking. There is a risk of breakage of the external electrodes 55, 56, and 57 in that, when applying the first soft adhesive layers 58 and 59 to the outer coating substrate 53 and 54, the adhesive tends to flow out from the periphery of the outer coating substrate 53 and 54 to the side edge portions of the layered body due to its relative softness, and the flow of adhesive to the side edges portions of the layered body prevents the external electrodes 55, 56, and 57 from being properly formed by thin-film deposition or by coating and curing a conductive paste.

In the first step of manufacturing the piezoelectric device 51, the first layer 58 of a soft adhesive is provided on a surface of the planar outer coating substrate 53, and the first layer 59 of the soft adhesive is provided on a surface of the planar outer coating substrate 54. The viscosity of an adhesive having a Shore D hardness of not more than 60 is generally not more than $1.5 \times 10^5$ mPas at 25° C. Therefore, in spite of being provided with the cut-away through-holes 58b and 59b, there is a risk of the adhesive flowing into the cut-away through-holes 58b and 59b, and flowing out of the periphery on which the external electrodes 55, 56, and 57 are provided, thereby causing a risk of breakage.

The above-described problem is eliminated when an adhesive having a Shore D harness of not more than 60 and having a viscosity before curing of at least approximately $3.0 \times 10^5$ mPas at 25° C. is used, however, such an adhesive is difficult to produce.

When manufacturing the piezoelectric device 51, the second layers 60 and 61 of a hard adhesive are provided on the first layers 58 and 59. In this case, recesses are provided in the second layers 60 and 61 in the layered body by the cut-away through-holes 58b and 59b of the first layers 58 and 59 disposed under the second layers 60 and 61. Specifically, the thickness of the adhesive varies between a region at the periphery of the layered body on which the external electrodes 55, 56, and 57 are provided and the remaining region on which the external electrodes 55, 56, and 57 are not provided, which produces gaps at the periphery of the layered body, thereby causing a risk of breakage of the external electrodes 55, 56, and 57.

SUMMARY OF THE INVENTION

In order to overcome the problems described above, preferred embodiments of the present invention provide a reliable piezoelectric device and a method for manufacturing the same, in which a space for vibration of the piezoelectric vibration unit is provided, the stress produced by a variation in temperature during reflow soldering or other suitable methods is suppressed, the frequency characteristics are not altered, and the risk of breakage of external electrodes caused by adhesive layers is greatly reduced.

According to a preferred embodiment of the present invention, a piezoelectric device includes a piezoelectric substrate provided with driving electrodes on the major surfaces thereof and opposing each other, outer coating substrates, each of which is laminated on the major surfaces of the piezoelectric substrate, adhesive layers to bond the piezoelectric substrate and the outer coating substrates to each other at the major surfaces of the piezoelectric substrate, and a plurality of external electrodes provided on lateral side surfaces of a layered body including the piezoelectric substrate, the outer coating substrates, and the adhesive layers. Each of the adhesive layers includes a first layer of an adhesive having a Shore D hardness after curing of not more than approximately 60 which is arranged such that the first layer is not exposed in a region of the lateral side surfaces of the layered body having the plurality of external electrodes provided thereon, a second layer of an adhesive having a Shore D hardness after curing of at least approximately 60, and a third layer of an adhesive having a Shore D hardness after curing of at least approximately 60, and having a viscosity before curing of at least approximately $3.0 \times 10^5$ mPas at a temperature of 25° C. The third layer is disposed between the periphery of the first layer and the region of the lateral side surfaces of the layered body which is provided with the plurality of external electrodes thereon. The second layer is laminated on the first layer and the third layer.

According to a preferred embodiment of the present invention, the first layer and the third layer of each of the adhesive layers are disposed adjacent to the outer coating substrate and the second layer of each of the adhesive layers is disposed adjacent the piezoelectric substrate.

In the piezoelectric device according a preferred embodiment of the present invention, the first layer of each of the adhesive layers is provided with through-holes at the lateral side portions of the layered body, and the third layer of each of the adhesive layers is disposed in these through-holes, such that the first layer is not exposed in a region of the lateral side portions of the layered body having the plurality of external electrodes provided thereon.

The piezoelectric device according to preferred embodiments of the present invention, which may be used as various piezoelectric devices such as a piezoelectric resonator, a piezoelectric filter, or other suitable devices, may include a plurality of the driving electrodes to produce a piezoelectric filter.

According to another preferred embodiment of the present invention, a method for manufacturing a piezoelectric device is provided. The piezoelectric device including a piezoelectric substrate provided with driving electrodes on the major surfaces thereof and opposing each other, outer coating substrates, each of which is laminated on the major surfaces of the piezoelectric substrate, adhesive layers to bond the piezoelectric substrate and the outer coating substrates to each other at the major surfaces of the piezoelectric substrate, and a plurality of external electrodes provided on lateral side surfaces of a layered body including the piezoelectric substrate, the outer coating substrates, and the adhesive layers. Each of the adhesive layers includes a first layer of an adhesive having a Shore D harness after curing of not more than approximately 60 which is disposed such that the first layer is not exposed in a region of the lateral side surfaces of the layered body having the plurality of external electrodes provided thereon, a second layer of an adhesive having a Shore D hardness after curing of at least approximately 60, and a third layer of an adhesive having a Shore D hardness, after curing, of at least approximately 60, and having a viscosity before curing of not less than approximately $3.0 \times 10^5$ mPas at a temperature of 25° C., the third layer being disposed between the periphery of the first layer and the region of the lateral side surfaces of the layered body having the plurality of external electrodes provided thereon. The second layer is laminated on the first layer and the third layer. The method for manufacturing the piezoelectric device includes the steps of forming the third layer of each of the adhesive layers on a major surface of each of the outer coating substrates, forming the first layer of each of the adhesive layers in a region of the major surface of each of the outer coating substrates which is not provided with the third layer, preparing the second layer of each of the adhesive layers, and bonding, via the second layer, the piezoelectric substrate and the outer coating substrates to each other, the outer coating substrates being provided with the third layer and the first layer.

Other features, elements, characteristics and advantages of the present invention will become apparent from the detailed description of preferred embodiments thereof with reference to the drawings attached hereto.

DETAILED DESCRIPTION OF PREFERRED EMBODIMENTS

In the following, preferred embodiments of the present invention will be described with reference to the accompanying drawings.

Figure 1:
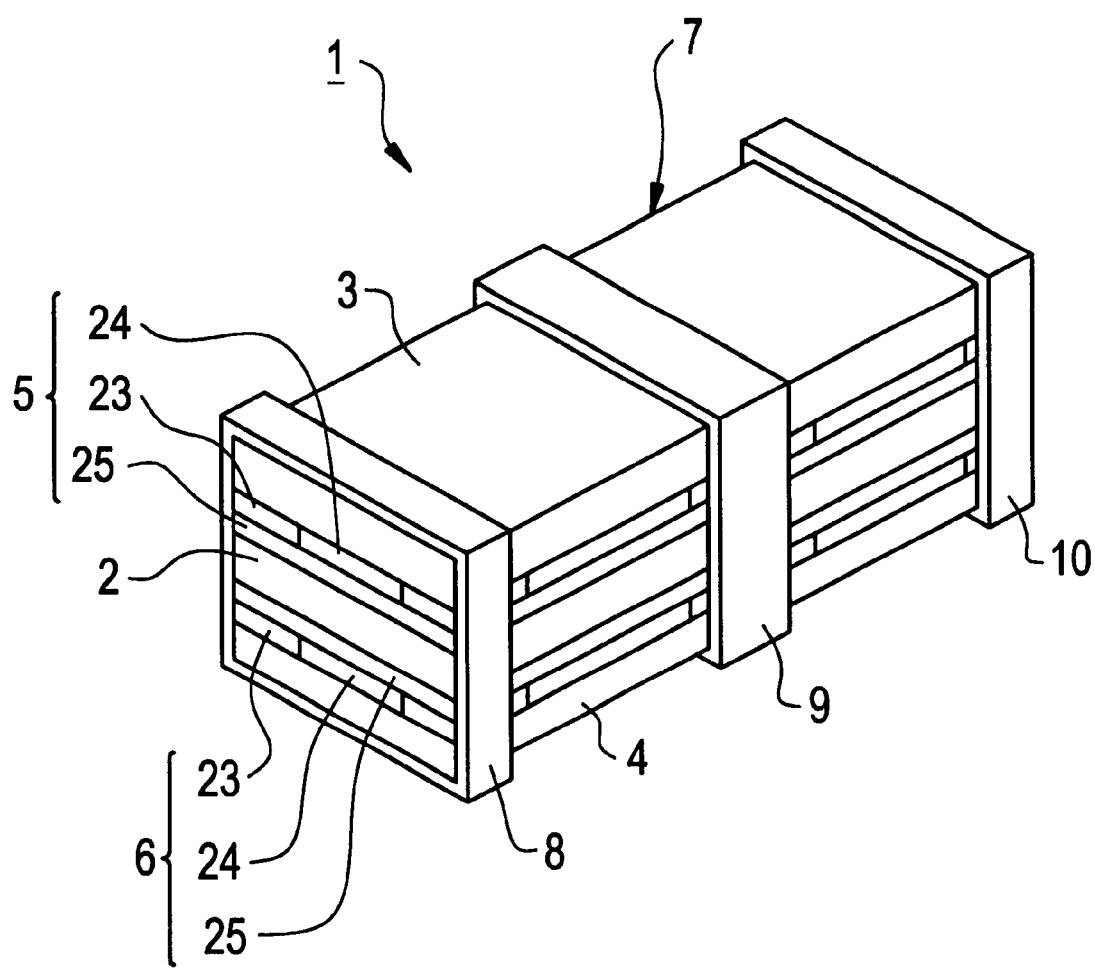
FIG. 1 is a perspective view of a piezoelectric device according to a preferred embodiment of the present invention.
Figure 2:
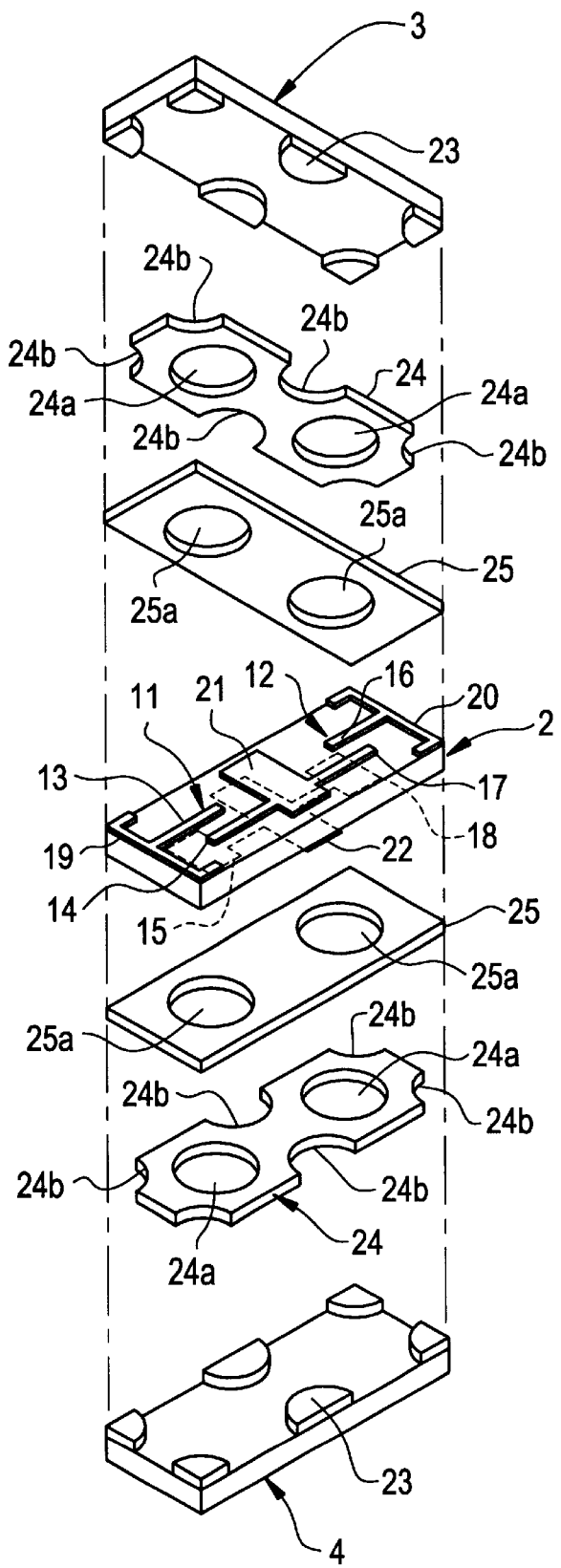
FIG. 2 is an exploded perspective view of the piezoelectric device shown in FIG. 1.

FIG. 1 is a perspective view of a piezoelectric device according to a preferred embodiment of the present invention, and FIG. 2 is an exploded perspective view of the same.

A piezoelectric device 1 shown in FIG. 1 includes a piezoelectric substrate 2 having first and second outer coating substrates 3 and 4 laminated thereon via first and second adhesive layers 5 and 6, respectively. A layered body 7 is configured with the piezoelectric substrate 2, the first and second outer coating substrates 3 and 4, and the first and second adhesive layers 5 and 6.

The layered body 7 is provided with first, second, and third external electrodes 8, 9, and 10 wrapped around the layered body 7 along the upper surface, the two side surfaces, and the lower surface.

As shown in FIG. 2, the piezoelectric substrate 2 preferably has a substantially rectangular shape, and is preferably made of a piezoelectric monocrystal material including quartz, or a piezoelectric ceramic such as a lead-zirconate-titanate-type ceramic, or other suitable materials.

As shown in FIG. 2, the piezoelectric substrate 2 is provided with energy-trap-type piezoelectric vibration units 11 and 12. The piezoelectric vibration unit 11 includes driving electrodes 13 and 14 disposed on the upper surface of the piezoelectric substrate 2 and a common driving electrode 15 disposed on the lower surface of the piezoelectric substrate 2 to oppose the driving electrodes 13 and 14. The piezoelectric vibration unit 12 includes driving electrodes 16 and 17 disposed on the upper surface of the piezoelectric substrate 2 and a common driving electrode 18 disposed on the lower surface of the piezoelectric substrate 2 to oppose the driving electrodes 16 and 17.

The driving electrode 13 of the piezoelectric vibration unit 11 is electrically connected to an input lead electrode 19. The lead electrode 19 is disposed in the vicinity of a longitudinal end of the piezoelectric substrate 2, extending between the lateral side surfaces along the upper edge of the longitudinal end of the piezoelectric substrate 2. The driving electrode 16 of the piezoelectric vibration unit 12 is electrically connected to an output lead electrode 20. The lead electrode 20 is disposed in the vicinity of the other longitudinal end of the piezoelectric substrate 2, extending between the lateral side surfaces along the upper edge of the other longitudinal end of the piezoelectric substrate 2.

The driving electrodes 14 and 17 are electrically connected to a capacitor electrode 21 disposed in the approximate center portion of the upper surface of the piezoelectric substrate 2. The capacitor electrode 21 opposes a grounding electrode 22 disposed in the approximate center portion of the lower surface of the piezoelectric substrate 2. The grounding electrode 22 is electrically connected to the driving electrodes 15 and 18. The grounding electrode 22, opposing the capacitor electrode 21, is disposed to extend between the two lower edge portions of the lateral side surfaces of the piezoelectric substrate 2.

In the layered body 7, the input lead electrode 19, the output lead electrode 20, and the grounding electrode 22 extend to the lateral side surfaces of the layered body 7, and are electrically connected to the external electrodes 8, 9, and 10, respectively.

The driving electrodes 13, 14, 15, 16, 17, and 18 which define the piezoelectric vibration units 11 and 12, the lead electrodes 19 and 20, the capacitor electrode 21, and the grounding electrode 22 are provided on the upper and lower surfaces of the piezoelectric substrate 2 by patterning a conductive material. The conductive material may be any metallic material such as Al, Ag, or Ag—Pd, or other suitable material.

When a piezoelectric ceramic is used, the piezoelectric substrate 2 is polarized in the thickness direction. Therefore, the piezoelectric vibration units 11 and 12 function as energy-trap-type piezoelectric resonator units which have a thickness or longitudinal vibration mode property.

The piezoelectric substrate 2, may be include a capacitor (not shown) provided with the piezoelectric vibration units 11 and 12, the capacitor electrode 21, and the grounding electrode 22, and a three-terminal-type piezoelectric filter, in which the external electrodes 8, 9, and 10 define terminals.

According to a preferred embodiment of the present invention, in the piezoelectric resonating device 1, the outer coating substrates 3 and 4 and the first and second adhesive layers 5 and 6, which seal the piezoelectric vibration units 11 and 12, are arranged such that there is no suppression of the vibration of the piezoelectric vibration units 11 and 12. The outer coating substrates 3 and 4 may be made of a ceramic material such as an insulative ceramic, a dielectric ceramic, or any other suitable material such as a synthetic resin. The outer coating substrates 3 and 4 may be composed of any proper insulative material so as to seal the piezoelectric vibration units 11 and 12.

According to a preferred embodiment of the present invention, the piezoelectric device 1 includes a unique arrangement of the first and second adhesive layers 5 and 6 which connect the outer coating substrates 3 and 4 with the piezoelectric substrate 2. The configuration of the first and second adhesive layers 5 and 6 shown in FIG. 1 is described as follows by describing a method for bonding the outer coating substrates 3 and 4 to the piezoelectric substrate 2.

When bonding the outer coating substrate 3 to the piezoelectric substrate 2, an adhesive having a Shore D hardness after curing of at least approximately 60, and having a viscosity before curing of at least approximately $3.0 \times 10^5$ mPas at 25° C. is applied to the lower surface of the outer coating substrate 3, which forms a third layer 23, the adhesive being a hot setting type epoxy-based adhesive, or other suitable adhesive. The third layer 23 is disposed on the lower surface of the outer coating substrate 3 at the periphery thereof. The third layer 23 is provided in regions of the periphery at which the external electrodes 8, 9, and 10 are disposed, as shown in FIG. 2.

After the third layer 23 is applied, a soft adhesive having a Shore D hardness after curing of not more than approximately 60, is applied to the lower surface of the outer coating substrate 3, which defines a first layer 24, the adhesive preferably being a hot-setting-type epoxy-based adhesive, or other suitable adhesive. The adhesive which defines the first layer 24 is applied such that through-holes 24a are formed to provide spaces such that no suppression of the vibration of the piezoelectric vibration units 11 and 12 occurs. The first layer 24 includes cut-away through-holes 24b in which the third layer 23 is disposed. Since the adhesive of the first layer 24 is soft, having a Shore D hardness of not more than approximately 60, the adhesive will flow out from the adhesive-coated regions. However, in the piezoelectric device 1 according to a preferred embodiment of the present invention, the adhesive of the first layer 24 is prevented from flowing out by the third layer 23 which has a viscosity before curing of at least approximately $3.0 \times 10^5$ mPas. The adhesive of the first layer 24 does not flow to the lower edge portions of the lateral side surfaces of the outer coating substrate 3, at which the external electrodes 8, 9, and 10 are disposed.

After the first layer 24 is formed, a second layer 25 including a hard adhesive, which has a Shore D hardness after curing of at least approximately 60, is applied. The adhesive of the second layer 25 is a hot-setting-type epoxy-based adhesive, or other suitable adhesive. The second layer 25 is provided with through-holes 25a so that the vibration of the piezoelectric vibration units 11 and 12 is not suppressed. The second layer 25 covers the upper surface of the piezoelectric substrate 2 except at the portions thereof associated with the through-holes 25a.

As shown in FIG. 2, in the same manner as in the outer coating substrate 3, the outer coating substrate 4 is bonded to the substrate 2, in which the third layer 23 is provided on the upper surface of the outer coating substrate 4, the first layer 24 is provided, then the second layer 25 is provided.

According to a preferred embodiment of the present invention, the first adhesive layer 5 and the second adhesive layer 6 both include the first layer 24, the second layer 25, and the third layer 23. The first layers 24 having through-holes 24a and 24b are applied to the outer coating substrates 3 and 4 such that the third layers 23 disposed on the outer coating substrates 3 and 4 are positioned in the cut-away through-holes 24b, whereby the second layers 25 are laminated on the first layers 24 and on the third layers 23 through the cut-away through-hole 24b of the first layers 24.

The first and second adhesive layers 5 and 6 positioned between the piezoelectric substrate 2 and the outer coating substrates 3 and 4 have substantially the same overall thickness when the thickness after curing of the first layers 24, the second layers 25, and the third layers 23 is substantially the same.

The thickness after curing of the first layers 24 is not necessarily substantially the same as the thickness after curing of the third layers 23, because the first layers 24 are soft. Therefore, when the thickness after curing of the first layers 24 is slightly greater than the thickness after curing of the third layers 23, the first layers 24 are compressed and the thickness thereof is reduced when the outer coating substrates 3 and 4 are pressed to the piezoelectric substrate 2 for bonding. The thickness of the adhesive layers 5 and 6, after the outer coating substrates 3 and 4 and the piezoelectric substrate 2 are assembled, is thereby substantially the same.

In the piezoelectric device 1 according to a preferred embodiment of the present invention, the second layers 25, preferably composed of hard adhesive having a Shore D hardness after curing of at least approximately 60, ensures that spaces around the piezoelectric vibration units 11 and 12 are maintained so that the vibration of the piezoelectric vibration units 11 and 12 is not prevented. The piezoelectric device 1 further provides damping of undesired vibration.

In the piezoelectric device 1 according to a preferred embodiment of the present invention, when the outer coating substrates 3 and 4 expand or contract due to the heat generated in mounting the device 1 on a printed circuit board, or other suitable electronic component, the stress caused by the expansion or the contraction is absorbed by the relatively soft first layers 24 provided between the second layers 25 and the outer coating substrates 3 and 4. Therefore, variation in the frequency characteristics of the device 1 after this expansion or contraction caused by soldering, a humid environment, or other adverse conditions, is prevented.

Moreover, the risk of breakage of the external electrodes 8, 9, and 10 caused by the adhesive of the first layers 24 flowing out to the peripheries of the outer coating substrates 3 and 4 in the regions of the electrodes 8, 9, and 10 is greatly reduced by providing the third layers 23 at the peripheries of the outer coating substrates 3 and 4.

The thickness of the adhesive layers 5 and 6 is determined by the first layers 24 which is provided on the surface of outer coating substrates 3 and 4 except in locations occupied by the third layers 23, thereby preventing breakage of the external electrodes 8, 9, and 10.

The third layers 23 are exposed at the lateral side surfaces of the layered body 7 in the positions at which the external electrodes 8, 9, and 10 are provided. However, a risk of breakage of the external electrodes 8, 9, and 10 is greatly reduced because the third layers 23 include an adhesive having a Shore D hardness after curing of at least approximately 60.

The adhesive used for the second layers 25 and the adhesive used for the third layers 23 are preferably the same type of adhesive when the adhesive has the above-described Shore hardness and viscosity. That is, the adhesive used for the second layers 25 has a viscosity, at a temperature of 25° C., of either not more than approximately $3\times10^5$ mPas or at least approximately $3\times10^5$ mPas.

The viscosity of the adhesive used for the third layers 23 is preferably at least approximately $3\times10^5$ mPas, according to a preferred embodiment of the present invention, because it is difficult to apply the third layers 23 so as to have the desired shape when having a viscosity of not more than approximately $3\times10^5$ mPas. The adhesive of the third layers 23 flowing out to the other portions causes a risk of breakage of the external electrodes 8, 9, and 10, which will be described with reference to FIG. 3.

Figure 3:
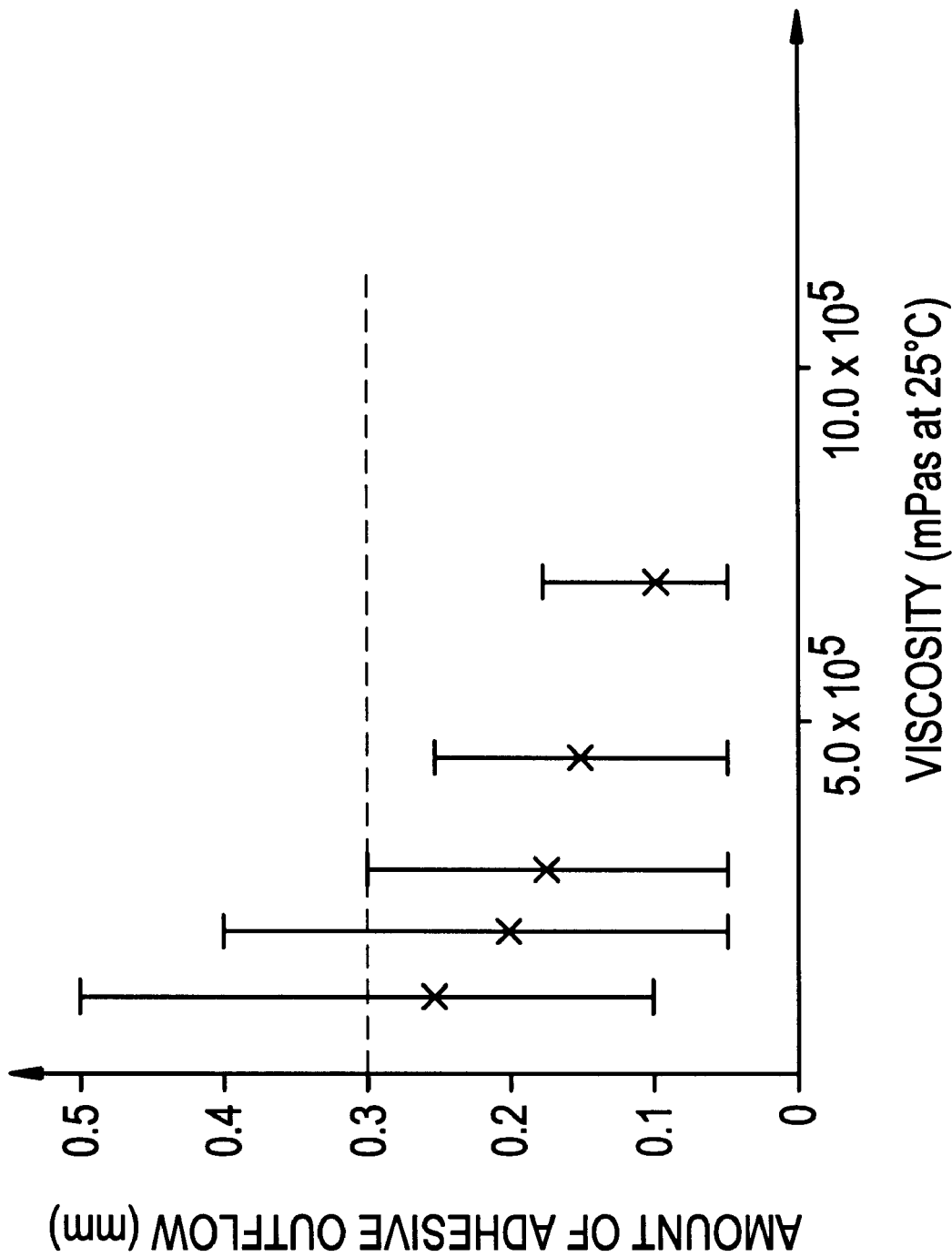
FIG. 3 is a graph showing the relationship between the viscosity of an adhesive and the amount of the adhesive flowing to a region having no adhesive applied.
Figure 4:
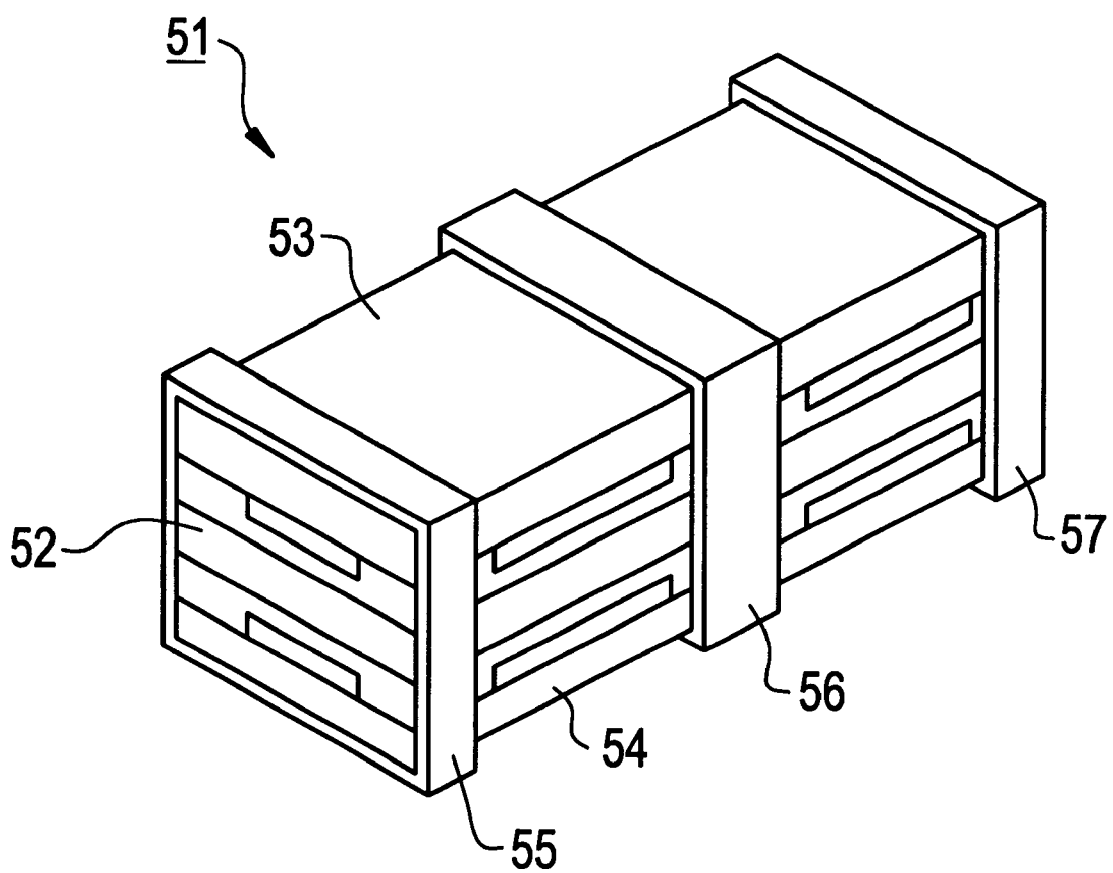
FIG. 4 is a perspective view of a known piezoelectric device.
Figure 5:
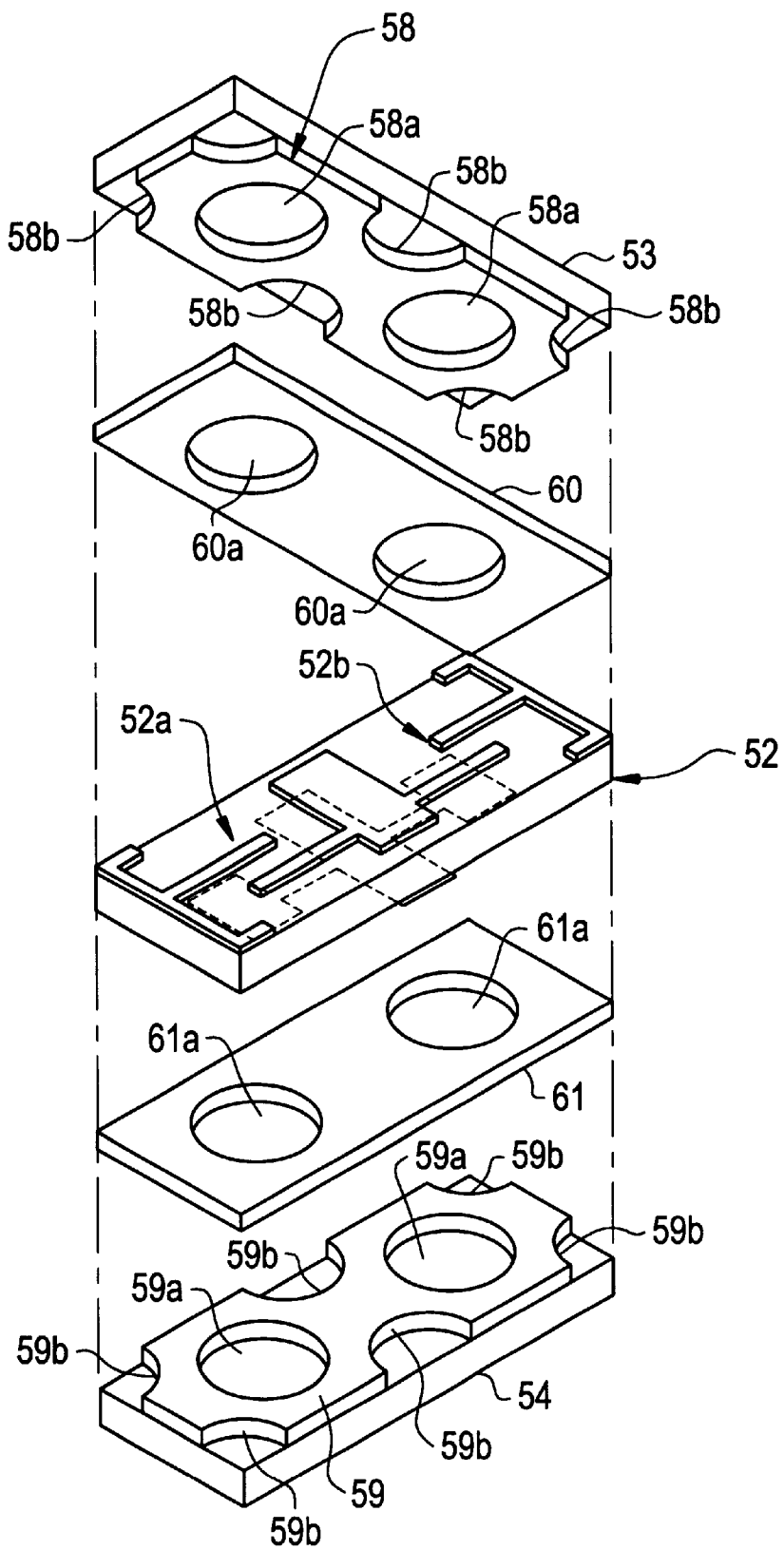
FIG. 5 is an exploded perspective view of the known piezoelectric device.

FIG. 3 is a graph showing the relationship between the viscosity of an adhesive and the amount of the adhesive outflow after the adhesive is applied. An adhesive having a Shore D hardness after curing of at least approximately 60 was applied at a temperature of 25° C. in a thickness of approximately 50 μm, and the amount of the adhesive outflow from the applied region was measured. The amount of the adhesive outflow was noticeably larger when the viscosity was less than approximately $3\times10^5$ mPas at 25° C. The external electrodes 8, 9, and 10 will be broken by the outflow of adhesive when the third layers 23 are composed of adhesive having a viscosity in this range. In contrast, by using an adhesive having a viscosity of at least approximately $3\times10^5$ mPas at 25° C., which produced an outflow of less than about 0.3 mm, the adhesive is prevented from flowing out to the lateral side surfaces on which the external electrodes 8, 9, and 10 are provided, and the third layers 23 under the second layers 25 can be formed to have the desired shape.

According to a preferred embodiment of the present invention, the piezoelectric device is provided with the first and second adhesive layers 5 and 6, each of which includes the first, second, and third layers 24, 25, and 23, respectively. When the outer coating substrates 3 and 4 expand or contract, the stress caused by the expansion or the contraction is absorbed by the relatively soft first layers, thereby greatly reducing variation in the characteristics of the device. Although the first layers 24 are relatively soft, these layers 24 are applied such that the adhesive thereof does not flow out to the portions of the lateral sides of the layered body 7, at which the external electrodes 8, 9, and 10 are provided, thereby reducing the risk of breakage of the external electrodes 8, 9, and 10 which is likely to occur by the outflow of the adhesive of the first layers 24.

According to a preferred embodiment of the present invention, by providing the relatively hard second layers 25, the resonating and filtering characteristics of the piezoelectric vibration units 11 and 12, which are provided with the driving electrodes 13, 14, 15, 16, 17, and 18 disposed on the piezoelectric substrate 2, are maintained as designed, and undesired vibration is damped, thereby providing excellent resonating and filtering characteristics.

With the arrangement in which the third layers 23, including an adhesive having the viscosity of at least approximately $3.0\times10^5$ mPas at 25° C. and the Shore D hardness after curing of at least approximately 60, are disposed in portions of the lateral side surfaces of the layered body 7 provided with the external electrodes 8, 9, and 10, and are disposed between the outer coating substrates 3 and 4 and the first layers 24, the third layers 23 can be applied in a desired shape and the outflow of the first layers 24 can be efficiently prevented by first applying the third layers 23 and followed by applying the first layers 24. The third layers 23 do not flow out to portions of the lateral side surfaces of the layered body 7 provided with the external electrodes 8, 9, and 10, because the third layers 23 have a relatively high viscosity as described above. The second layers 25 are provided on the first and the third layers 24 and 23, whereby the risk of formation of gaps due to an unevenness in the thickness of the adhesive at the lateral side surfaces of the layered body 7 is minimized, thereby eliminating the risk of breakage of the external electrodes 8, 9, and 10.

According to various preferred embodiments of the present invention, a reliable piezoelectric device is produced in a stable state with excellent resonating characteristics and filtering characteristics. Changes in the characteristics of the piezoelectric device over time are negligible, and breakage of the external electrodes of the device is prevented.

In the piezoelectric device according to preferred embodiments of the present invention, the first and third layers of each of the adhesive layers are disposed adjacent to the outer coating substrate, and the second layers of each of the adhesive layers are disposed adjacent to the piezoelectric substrate, whereby undesired vibration of the piezoelectric substrate are very effectively damped by the second layers. This arrangement effectively suppresses the undesired vibration.

According to preferred embodiments of the present invention, the first layers of the adhesive layers are provided with through-holes cut away at portions of the lateral side surfaces of the layered body, and the third layers of the adhesive layers are disposed in the cut-away through-holes, such that the first layers are not exposed in regions of the lateral side surfaces of the layered body provided with the external electrodes. The piezoelectric device according to preferred embodiments of the present invention are easily produced by configuring the first layers such that the cut-away through-holes are provided therein.

The piezoelectric devices according to preferred embodiments of the present invention are suitable for use as various piezoelectric resonators and piezoelectric filters. With the arrangement according to preferred embodiments of the present invention, the piezoelectric device is suitable for a reliable piezoelectric filter in which a plurality of the driving electrodes are configured to define the piezoelectric filter.

A method for manufacturing the piezoelectric device according to a preferred embodiment of the present invention includes the steps of applying third layers of first and second adhesive layers on major surfaces of first and second outer coating substrates, and forming first layers of the first and second adhesive layers on the sections of the major surfaces of the first and second outer coating substrates at which the third layers are not applied. The third layers are applied so as to have a desired shape, and the adhesive of the third layers does not flow out to the lateral side surfaces of the layered body, because the third layers include an adhesive having a relatively high viscosity. The outflow of the relatively soft adhesive of the first layers is also prevented due to the third layers. The method also includes the steps of applying second layers of the first and second adhesive layers after the first and third layers are applied, and bonding, via the second layers, a piezoelectric substrate and the first and second outer coating substrates to each other, whereby the adhesive layers are evenly disposed, thereby minimizing the risk of forming gaps at the lateral side surfaces of the layered body, and preventing breakage of external electrodes.

While the invention has been particularly shown and described with reference to preferred embodiments thereof, it will be understood by those skilled in the art that the forgoing and other changes in for and details may be made therein without departing from the scope of the invention.

What is claimed is:

1. A piezoelectric device comprising:
   a piezoelectric substrate provided with driving electrodes on opposing major surfaces thereof;
   a plurality of outer coating substrates, each of which is laminated on one of the opposing major surfaces of said piezoelectric substrate;
   adhesive layers arranged to bond the piezoelectric substrate and the plurality of outer coating substrates to each other at the opposing major surfaces of the piezoelectric substrate; and
   a plurality of external electrodes provided at regions of lateral side surfaces of a layered body including said piezoelectric substrate, said outer coating substrates, and said adhesive layers;
   wherein each of the adhesive layers includes a first layer of an adhesive having a Shore D hardness after curing of not more than approximately 60 which is arranged so as not to be exposed in the regions of the lateral side surfaces of the layered body which are provided with the plurality of external electrodes thereon, a second layer of an adhesive having a Shore D hardness after curing of at least approximately 60, and a third layer of an adhesive having a Shore D hardness after curing of at least approximately 60, and having a viscosity before curing of at least approximately $3.0 \times 10^5$ mPas at a temperature of 25° C., the third layer being arranged between portions of the periphery of the first layer and the regions of the lateral side surfaces of the layered body which are provided with the plurality of external electrodes thereon, and wherein said second layer is laminated on said first layer and said third layer.

2. A piezoelectric device according to claim 1, wherein the first layer and the third layer of each of the adhesive layers is disposed adjacent to the outer coating substrate and the second layer of each of the adhesive layers is disposed adjacent to the piezoelectric substrate.

3. A piezoelectric device according to claim 1, wherein the first layer of each of the adhesive layers is provided with through-holes at the lateral side surfaces of the layered body, and the third layer of each of the adhesive layers is disposed in the cut-away through-holes, such that the first layer is not exposed in the regions of the lateral side surfaces of the layered body provided with the plurality of external electrodes thereon.

4. A piezoelectric device according to claim 1, wherein the first layer of each of the adhesive layers is provided with additional through-holes at an approximately central portion thereof to prevent suppression of the vibration of the piezoelectric device.

5. A piezoelectric device according to claim 1, wherein a plurality of said driving electrodes define a piezoelectric filter.

6. A piezoelectric device according to claim 1, wherein the thickness of the first layer of each of the adhesive layers is approximately the same as the thickness of the third layer of each of the adhesive layers.

7. A piezoelectric device according to claim 1, wherein adhesive materials of the first layers of each of the adhesive layers are the same.

8. A piezoelectric device according to claim 1, wherein adhesive materials of the second layers of each of the adhesive layers are the same.

9. A piezoelectric device according to claim 1, wherein an adhesive material of the first layer of each of the adhesive layers has a viscosity of not more than approximately $3.0 \times 10^5$ mPas at a temperature of 25° C.

10. A piezoelectric device comprising:
    a piezoelectric substrate provided with driving electrodes on opposing major surfaces thereof;
    a plurality of outer coating substrates, each of which is laminated on one of the opposing major surfaces of said piezoelectric substrate;
    adhesive layers arranged to bond the piezoelectric substrate and the plurality of outer coating substrates to each other at the opposing major surfaces of the piezoelectric substrate; and
    a plurality of external electrodes provided at regions of lateral side surfaces of a layered body including said piezoelectric substrate, said outer coating substrates, and said adhesive layers;
    wherein each of the adhesive layers includes a first layer of an adhesive arranged so as not to be exposed in the regions of the lateral side surfaces of the layered body which are provided with the plurality of external electrodes thereon, a second layer of an adhesive, and a third layer of an adhesive, the third layer being disposed between portions of the periphery of the first layer and the regions of the lateral side surfaces of the layered body which are provided with the plurality of external electrodes, and wherein said second layer is laminated on said first layer and said third layer.

11. A piezoelectric device according to claim 10, wherein the adhesive of the first layer of each of the adhesive layers has a Shore D hardness after curing of not more than approximately 60.

12. A piezoelectric device according to claim 10, wherein the adhesive of the second layer of each of the adhesive layers has a Shore D hardness after curing of at least approximately 60.

13. A piezoelectric device according to claim 10, wherein the adhesive of the third layer of each of the adhesive layers has a Shore D hardness after curing of at least approximately 60.

14. A piezoelectric device according to claim 10, wherein the adhesive of the third layer of each of the adhesive layers has a viscosity of at least approximately $3.0 \times 10^5$ mPas at a temperature of 25° C.

15. A piezoelectric device according to claim 10 wherein an adhesive material of the third layer of each of the adhesive layers has a Shore D hardness after curing of at least approximately 60 and has a viscosity of at least approximately $3.0 \times 10^5$ mPas at a temperature of 25° C.

16. A piezoelectric device according to claim 10, wherein the first layer and the third layer of each of the adhesive layers is disposed adjacent to the outer coating substrate and the second layer of each of the adhesive layers is disposed adjacent to the piezoelectric substrate.

17. A piezoelectric device according to claim 10, wherein the first layer of each of the adhesive layers is provided with through-holes at the lateral side surfaces of the layered body, and the third layer of each of the adhesive layers is disposed in the cut-away through-holes, such that the first layer is not exposed in the regions of the lateral side surfaces of the layered body provided with the plurality of external electrodes thereon.

18. A piezoelectric device according to claim 10, wherein the first layer of each of the adhesive layers is provided with additional through-holes at an approximately central portion thereof to prevent suppression of the vibration of the piezoelectric device.

19. A piezoelectric device according to claim 10, wherein a plurality of said driving electrodes define a piezoelectric filter.

* * * * *